United States Patent [19]

Hileman

[11] 4,124,827

[45] Nov. 7, 1978

[54] VARIABLE SINUSOIDAL OSCILLATOR

[76] Inventor: Dale L. Hileman, 1132 Roseta Dr., Topanga, Calif. 90290

[21] Appl. No.: 852,322

[22] Filed: Nov. 17, 1977

Related U.S. Application Data

[63] Continuation-in-part of Ser. No. 761,522, Jan. 24, 1977, abandoned.

[51] Int. Cl.² ............................................. H03B 5/20
[52] U.S. Cl. ............................... 331/135; 331/108 B; 331/176; 331/183
[58] Field of Search ........... 331/108 B, 108 D, 108 C, 331/110, 135, 136, 137, 183, 176

[56] References Cited

U.S. PATENT DOCUMENTS

| | | | |
|---|---|---|---|
| 3,500,246 | 3/1970 | Werner | 331/183 |
| 3,781,841 | 12/1973 | Hughes, Jr. | 331/108 D |
| 3,873,943 | 3/1975 | Reijnders | 331/183 |

OTHER PUBLICATIONS

Electronics, p. 97, Mar. 17, 1969.
Electronic Design, Feb. 15, 1973, p. 82.

*Primary Examiner*—John Kominski
*Attorney, Agent, or Firm*—Lindenberg, Freilich, Hornbaker, Wasserman, Rosen & Fernandez

[57] ABSTRACT

A variable sinusoidal oscillator comprised of an operational amplifier connected in a unity-gain configuration, with a positive-feedback capacitor connected between the output and the noninverting input of the amplifier, and a resistor between the noninverting input and circuit ground, either in the form of an external resistor or simply in the form of the input resistance of the amplifier. A linear attenuator may be connected in the negative-feedback circuit, and a nonlinear attenuator may be connected in tandem with the capacitor, or vice versa.

3 Claims, 6 Drawing Figures

VARIABLE SINUSOIDAL OSCILLATOR

CROSS REFERENCE TO RELATED APPLICATION

This application is a continuation in part of Application Ser. No. 761,522 filed Jan. 24, 1977, and now abandoned.

BACKGROUND OF THE INVENTION

This invention relates to sinusoidal oscillators, and more particularly to a feedback-type oscillator employing a linear operational amplifier (op amp) connected in a unity-gain configuration.

Sinusoidal oscillators are basic building blocks in electronic equipments of all kinds. In the conventional feedback-type oscillator, positive feedback is provided to sustain oscillation through a frequency-determing r-c network such as a Wien bridge, and negative feedback is provided to control the gain of the op amp and adjusted so as to exactly make up for the loss of signal in the frequency-selective network, thus making overall loop gain equal 1. A thermistor or other voltage-sensitive non-linear attenuator is used in one of the feedback paths to stabilize the oscillator.

The main difficulty in designing an oscillator of the type described above to be variable in frequency is getting reasonably constant loop gain. To achieve fairly constant positive feedback over a wise frequency range usually requires either an extraordinarily sensitive gain-control system or an elaborate tuning scheme, requiring for example awkward dual ganged variable resistors or capacitors. In any case such an oscillator uses a large number of parts and may require delicate adjustment for optimum performance.

SUMMARY OF THE INVENTION

The present invention circumvents the problem of frequency sensitivity in the feedback circuit by making circuit gain essentially unity, and by reducing losses in the feedback network to essentially zero. That is accomplished with an operational amplifier connected in the unity-gain configuration with a capacitor connected between its output and its noninverting input, and with resistance between the noninverting input and circuit ground. That resistance may be made up of input resistance of the amplifier or an external resistor, or both. A nonlinear attenuator is connected in tandem with the capacitor, either between the output of the amplifier and the capacitor, or between the capacitor and the noninverting input of the amplifier, and a linear attenuator is connected in the negative feedback circuit. Alternatively, the linear attenuator is connected in tandem with the capacitor and the nonlinear attenuator in the negative feedback circuit. Or two nonlinear attenuators may be used, one connected in tandem with the capacitor and the other in the negative feedback circuit.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
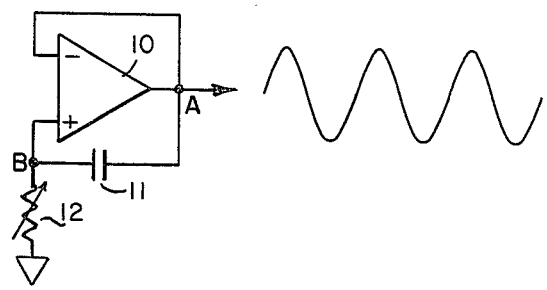
FIG. 1 is a diagram of the basic circuit.

Referring to FIG. 1, a basic sinusoidal oscillator consists of an operational amplifier 10 connected in a unity-gain configuration with its output connected to its inverting input terminal. Positive feedback is obtained through a R-C network consisting of a feedback capacitor 11 and a resistor 12 connecting the noninverting input to circuit ground. That resistance may take the form of input resistance or an external resistor, or both. It is preferable to employ a variable external resistor as shown in order to adjust the frequency of oscillation. By choosing R and C values such that the reactance $X_c$ of the capacitor at the operating frequency is much smaller than the resistor value, we make the network essentially lossless. Given an $R/X_c$ of 1,000 many op amps such as a CA 3140T will oscillate when connected just as shown in the circuit of FIG. 1.

As in any oscillator, oscillation takes place at a frequency where loop phase shift is zero; that is, where the phase shift introduced by the R-C network is equal and opposite to that of the amplifier that compensates for any attenuation it introduces. In this basic circuit, then, to vary the frequency of oscillation it is necessary only to vary the resistor value so that the lead of the R-C network at the desired frequency equals the lag introduced by the op amp. Feedback remains essentially constant over the frequency range of the oscillator because as R is varied to change the frequency, the voltage-division ratio of $R/X_c$ remains constant. Thus a wide adjustment range is possible with only a single circuit element (resistor 12 as shown or capacitor 11) serving as frequency control.

In operation, the gain is not exactly unity at all times. Modulation of the common-mode range, nonlinearity of the operational amplifier, semiconductor noise, etc., prevent the gain from ever being exactly equal to 1. However, the gain is essentially equal to 1, and it is adequate to sustain oscillation.

The circuit oscillates because there is a small propagation delay in any operational amplifier. As in any oscillator, the overall delay or phase shift must be zero to ensure oscillation. In this circuit, the capacitor introduces a slightly leading phase shift to compensate for the lag introduced by the operational amplifier. For that reason the waveform at point B will lead that at point A, and the operational amplifier sustains oscillation by trying to make the output at point A "catch up" to the input at point B.

If the gain of the operational amplifier should be slightly more than essentially unity, i.e., slightly greater than the value required for oscillation, the circuit will oscillate, but the output waveform will be square, and not sinusoidal. If it is slightly less than essentially unity, the circuit will not oscillate. Only when the gain of the operational amplifier is essentially equal to 1 will a sine wave be generated as shown.

Of course the basic circuit of FIG. 1 is not practical because as in any R-C sinewave oscillator, loop gain must be controlled over very narrow limits to ensure constant output. Hence this circuit will deliver a sine-wave only at very specific settings of frequency, offset, supply voltage, etc, where loop gain is essentially equal to 1. Where it is less, no oscillation will occur, and where more, oscillation builds up rapidly to cause amplifier saturation and hence distortion. Furthermore, since the R-C network is not frequency selective, perturbations due to circuit noise or thermal effects cause instability, tending to modulate the output waveform. Because both effects are exaggerated by near-lossless coupling in the positive-feedback path, the unity-gain circuit of FIG. 1 has until recently been virtually impossible to implement. The development of the Veco type 32A3 bead thermistor as a nonlinear resistor has made a practical unity-gain oscillator possible. Originally designed for use in microwave sensing applications, the 32A3 has the high sensitivity, and more important, the rapid response, necessary to cope with the very demanding requirements of the present invention.

Figure 2:
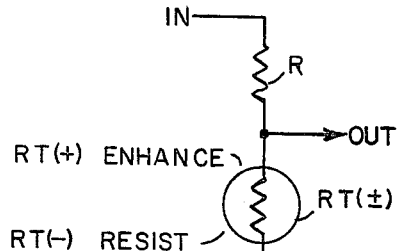
FIG. 2 is a diagram of a first species of a nonlinear attenuator to be used in the basic circuit.
Figure 3:
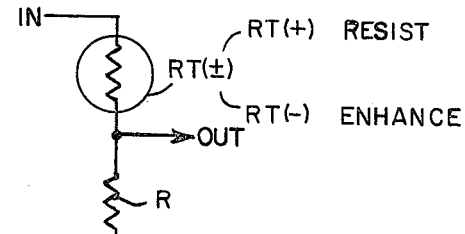
FIG. 3 is a diagram of a second species of a nonlinear attenuator to be used in the basic circuit.

FIGS. 2 and 3 illustrate two different kinds of nonlinear attenuators to be used in the present invention. In each, a resistor R is connected in series with a temperature compensating (tempco) resistor RT ($\pm$), such as the Veco type 32A3 bead thermistor. If the resistor RT has a negative ($-$) temperature coefficient, the circuit of FIG. 2 will resist any change in its input voltage, and the circuit of FIG. 3 will enhance any such change. If the resistor RT has a positive ($+$) temperature coefficient, the circuit of FIG. 2 will enhance, and the circuit of FIG. 3 will resist. This is indicated in FIGS. 2 and 3 by the notation for the selected tempco polarity ($+$) or ($-$) of the resistor RT in each configuration.

Figure 4:
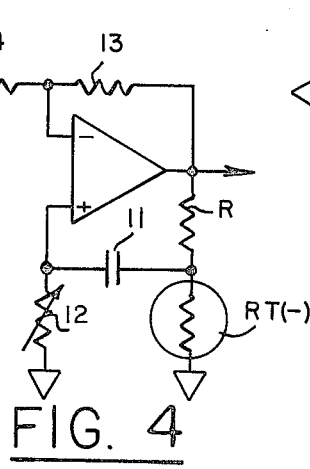
FIG. 4 is a circuit diagram of one embodiment of the invention.

As shown in the practical circuit of FIG. 4, a thermistor RT ($-$) is used with a resistor R as a nonlinear attenuator to regulate the positive feedback. To compensate for the loss introduced by this voltage divider, a linear attenuator comprised of resistors 13 and 14 is used in the negative-feedback circuit. The resistor 14 may be variable to adjust for difference between individual thermistors or to adjust the output level. If it were desired to place the nonlinear attenuator in the negative-feedback circuit, the thermistor RT could be interchanged with resistor 13. Resistance values in the feedback circuits would then have to be readjusted, of course, to re-establish unity loop gain.

In the configuration shown in FIG. 4, the achieved frequency range is 5 khz to 100 khz, or 20:1, with adjustment of only the frequency control resistor 12. Over this range, the output level is almost perfectly constant. With some circuit changes that only slightly degraded performance in other respects, a range of 50:1 has been obtained.

Because most of the perturbations with which the thermistor is required to deal occur at the lower end of the audio range, the fast response of the thermistor itself places limits upon the lowest frequency at which the circuit is effective as a variable oscillator. With the circuit as shown in FIG. 4, using larger values for the resistor 12 and capacitor 11 to lower the operating frequency introduces distortion as the thermistor attempts to effect instantaneous corrections of the output amplitude. Nevertheless a clean sinusoidal waveform can be obtained at lower frequencies by limiting the loop frequency response. One easy way to do that requires only a capacitor connected across the negative feedback resistor 13 or the thermistor RT. However, given this change, the output level is no longer constant with frequency adjustment.

Again, because of the near-lossless feedback coupling and its inability to reject signals at other than the oscillating frequency, noise from any of the circuit elements will disproportionally manifest itself as modulation of the output waveform. The resistors should therefore be of good quality, preferably the film type. Certain composition types are so noisy as to make their use in this circuit impossible. A variable resistor has been suggested for the resistor 14, but many pots are inherently noisy; therefore a selected fixed resistor is to be preferred there, as shown.

Some instability may be caused by impedance of the conductors from the power supply. To minimize the probability of this effect, it is possible to connect small capacitors at the op amp from its $+V_{cc}$ and $-V_{cc}$ terminals to ground.

Figure 5:
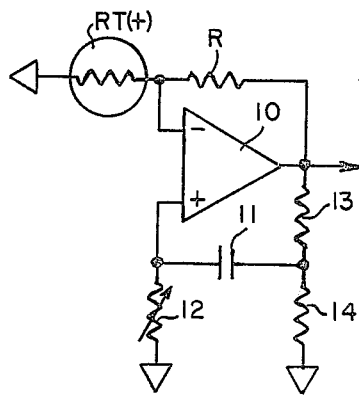
FIG. 5 is a circuit diagram of another embodiment of the invention.
Figure 6:
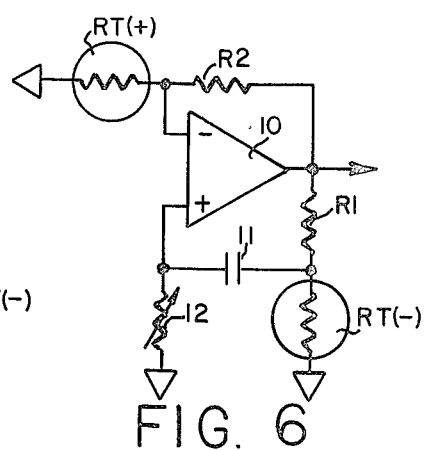
FIG. 6 is a circuit diagram of still another embodiment of the invention.

As noted hereinbefore, a linear attenuator comprised of resistors 13 and 14 is added in the negative-feedback circuit to restore unity loop gain that has been upset by the nonlinear attenuator in the positive feedback circuit. The nonlinear attenuator could be placed in the negative-feedback circuit, as shown in FIG. 5, in which case the nonlinear attenuator is selected to be of the enhancing type and the linear attenuator is moved over the positive feedback circuit. In either case (FIG. 4 or FIG. 5), the nonlinear attenuator configuration of FIG. 3 may be employed instead of that of FIG. 2, in which case the temperature coefficient polarity selected is opposite that shown in FIGS. 4 and 5. A nonlinear attenuator could be placed in both the positive and negative feedback circuits, as shown in FIG. 6, in which case a resisting-type attenuator would be used in the positive-feedback circuit.

The output level of the sinusoidal oscillator is very constant over a wide range of frequency. There are two reasons for this. First, the resistor 12 may be chosen to have a large reactance over the desired frequency range as compared to the reactance of the capacitor. There is therefore little loss across the capacitor. The other reason involves servo theory. As has been pointed out, circuit feedback is very critical. An overall loop gain slightly greater than unity causes a large increase in output, whereas a gain slightly less stops oscillation completely. Thus the effect of the resistor RT is very pronounced. A small change in its resistance causes a large change in the output level of the circuit. This has the same effect as extremely high gain in any other kind of servo system; it tends to keep the output controlled very tightly.

Frequency is most easily controlled in this circuit by varying the resistor 12. With the following values in the circuit of FIG. 4, using a type CA 3140T operational amplifier, Resistor RT ($-$) = Veco Type 32A3 thermistor
Resistor 12 = 5 megohm pot
Resistor 13 = 10k ohms
Resistor 14 = 10k ohms
Resistor R = 1500 ohms
Capacitor 1 = 0.01 $\mu$f output is essentially constant over a frequency range of 5 kHz to 100 kHz. Another example, using a type 741 operational amplifier, with the following values Resistor RT ($-$) = Veco Type 32A3 thermistor
Resistor 12 = 2 megohm pot
Resistor 13 = 10 k ohms
Resistor 14 = 10 k ohms Resistor R = 470 ohms
Capacitor 11 = 0.01 µf produces an output essentially constant over a frequency range of 2 kHz to 20 kHz. Using other op amps and other circuit values, a frequency range of 50:1 has been obtained with constant output as noted hereinbefore. Resistors 13 and 14 have been selected to be equal because the resistor R is selected to be equal to the resistor RT when the circuit is in operation. This provides assurance of a loop gain of one over a wide range of frequencies selected by the resistor 12.

Although a particular embodiment of the invention has been described and illustrated herein, it is recognized that modifications and variations may readily occur to those skilled in the art. It is therefore intended that the claims be interpreted to cover such modifications and variation. For example, anyone skilled in the art will immediately acknowledge that a nonlinear attenuator circuit may be constructed in an unlimited number of different circuit configurations, and need not necessarily employ a temperature-sensitive resistor. One such circuit might employ a rectifier and a field-effect transistor. The rectifier would translate the amplitude of the input sinewave to a d-c voltage, which would be applied to the gate of the transistor. The transistor could in turn be connected in a resistive attenuator network so as to control the amplitude of the sinewave output. The term "nonlinear attenuator" therefore means any attenuator, active or passive, whose output amplitude is a nonlinear function of its input amplitude.

Although particular embodiments of the invention have been described and illustrated herein, it is recognized that modifications and variations may readily occur to those skilled in the art. It is therefore intended that the claims be interpreted to cover such modifications and variations.

I claim:

1. A stabilized sinusoidal oscillator consisting of an operational amplifier having an output terminal, an inverting input terminal, and a non-inverting input terminal, said amplifier being connected to achieve unity loop gain by a negative feedback circuit and a positive feedback circuit, said negative feedback circuit consisting of an attenuator connected between the output terminal of said amplifier and the inverting input terminal of said amplifier, and said positive feedback circuit consisting of an attenuator and a single RC network between the output terminal of said amplifier and the noninverting input terminal of said amplifier, wherein the attenuator in at least one of said feedback circuits consists of two voltage-dividing resistors, one a temperature-compensating nonlinear resistor.

2. A circuit as defined in claim 1 wherein said nonlinear resistor is in the positive feedback circuit.

3. A circuit as defined in claim 1 wherein said nonlinear resistor is in the negative feedback circuit.

* * * * *